United States Patent
Ohno et al.

(10) Patent No.: US 9,746,140 B2
(45) Date of Patent: Aug. 29, 2017

(54) LED LIGHTING DEVICE

(71) Applicant: KABUSHIKI KAISHA TOSHIBA, Minato-ku, Tokyo (JP)

(72) Inventors: Hiroshi Ohno, Kanagawa (JP); Mitsuaki Kato, Kanagawa (JP); Katsumi Hisano, Chiba (JP); Yoshinori Honguh, Kanagawa (JP); Masataka Shiratsuchi, Kanagawa (JP); Yuichiro Yamamoto, Kanagawa (JP); Hiromichi Hayashihara, Saitama (JP); Masatoshi Hirono, Kanagawa (JP); Takeshi Morino, Kanagawa (JP)

(73) Assignees: KABUSHIKI KAISHA TOSHIBA (JP); TOSHIBA MATERIALS CO., LTD. (JP)

( * ) Notice: Subject to any disclaimer, the term of this patent is extended or adjusted under 35 U.S.C. 154(b) by 260 days.

(21) Appl. No.: 14/663,596

(22) Filed: Mar. 20, 2015

(65) Prior Publication Data
US 2015/0192258 A1    Jul. 9, 2015

Related U.S. Application Data

(63) Continuation of application No. PCT/JP2013/074772, filed on Sep. 12, 2013.

(30) Foreign Application Priority Data

Sep. 20, 2012    (JP) ................. 2012-207459

(51) Int. Cl.
*F21V 7/04* (2006.01)
*F21K 99/00* (2016.01)
(Continued)

(52) U.S. Cl.
CPC .................. *F21K 9/52* (2013.01); *F21K 9/61* (2016.08); *F21K 9/64* (2016.08); *F21V 9/16* (2013.01);
(Continued)

(58) Field of Classification Search
CPC ....... H01L 33/507; H01L 33/54; H01L 33/60; F21V 3/0427; F21V 9/16; F21V 9/89;
(Continued)

(56) References Cited

U.S. PATENT DOCUMENTS

| 6,294,800 B1 | 9/2001 | Duggal et al. |
| 2008/0232084 A1* | 9/2008 | Kon ..................... G02B 6/0003 362/84 |
| 2010/0308354 A1 | 12/2010 | David et al. |
| 2011/0266939 A1 | 11/2011 | Wang et al. |

FOREIGN PATENT DOCUMENTS

| CN | 102272514 A | 12/2011 |
| CN | 102460748 A | 5/2012 |

(Continued)

OTHER PUBLICATIONS

Office Action regarding Notification of Reasons for Refusal mailed on Apr. 26, 2016 in corresponding application No. 2012-207459 filed in Japan (with English translation). (4 pages).

(Continued)

*Primary Examiner* — Renee Chavez
*Assistant Examiner* — Omar Rojas Cadima
(74) *Attorney, Agent, or Firm* — Harness, Dickey & Pierce, P.L.C.

(57) ABSTRACT

An LED lighting device of embodiment comprising an LED light source which generates an ultraviolet light or a visible light, an axisymmetric transparent member which is provided over the light source and which is transparent to visible light, and an axisymmetric light scattering member disposed in the transparent member apart from the light (Continued)

source. A distance of closest approach $L_2$ between the light source and the light scattering member, and an area C of a light emitting surface of the light source satisfy the settled relation. A length $L_1$ of the light scattering member, and an absorption coefficient μ (1/mm) of the light scattering member satisfy the settled relation. A diameter $d_1$ of the bottom surface of the light scattering member, the distance of closest approach $L_2$, and a refractive index n of the transparent member satisfy the settled relation.

13 Claims, 8 Drawing Sheets

(51) Int. Cl.
  *H01L 33/50* (2010.01)
  *H01L 33/54* (2010.01)
  *F21V 29/89* (2015.01)
  *F21V 9/16* (2006.01)
  *F21K 9/61* (2016.01)
  *F21K 9/64* (2016.01)
  *H01L 33/60* (2010.01)

(52) U.S. Cl.
  CPC ............ *F21V 29/89* (2015.01); *H01L 33/507* (2013.01); *H01L 33/54* (2013.01); *H01L 33/60* (2013.01)

(58) Field of Classification Search
  CPC ..... F21K 9/61; F21K 9/52; F21K 9/54; G02B 6/0051; F21S 48/2268
  USPC .......................... 362/603, 606, 555, 514, 355
  See application file for complete search history.

(56) References Cited

FOREIGN PATENT DOCUMENTS

| EP | 2385400 A2 | 11/2011 |
| JP | 2005/095335 A | 4/2005 |
| JP | 3165183 U | 1/2011 |
| JP | 2011/238609 A | 11/2011 |
| TW | 201139921 A | 11/2011 |
| WO | WO-0140702 A1 | 6/2001 |
| WO | WO-2010079391 A1 | 7/2010 |

OTHER PUBLICATIONS

Allen, Steven C., et al. "ELiXIR-Solid-State Luminaire with Enhanced Light Extraction by Internal Reflection". Journal of Display Technology, (Jun. 2007) (pp. 155-159) vol. 3, No. 2. (5 pages).
Narendran, Nadarahjah. "Improved Performance White LED". Fifth International Conference on Solid State Lighting, Proceedings of SPIE 5941, 45-40. International Society of Optical Engineers. (7 pages).
Chaves, Julio. "Introduction to Nonimaging Optics", 2008, CRC Press (3 pages).
Extended European Search Report dated Apr. 6, 2016 regarding Application No. 13839605.6 (8 pages).
Office Action regarding Notification of Reasons for Refusal dated Jul. 26, 2016 for corresponding Application No. 2012-207459 filed in Japan (with English translation) (5 pages).
PCT International Preliminary Report and Written Opinion of the International Searching Authority from International Bureau of WIPO filed on Sep. 12, 2013 (7 pages).
International Search Report for PCT/JP2013/074772 mailed on Oct. 8, 2013.
Office Action (in Chinese) dated May 3, 2017 regarding corresponding China Application No. 201380043660.1 (5 pages).

* cited by examiner

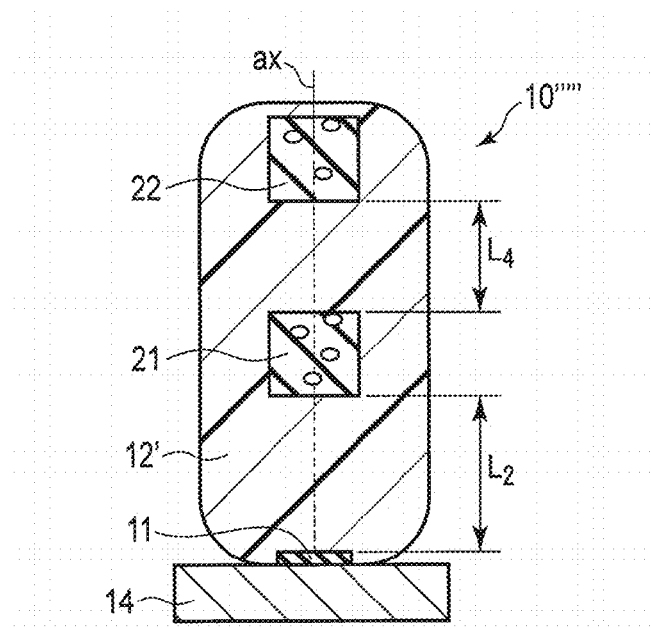
F I G. 11
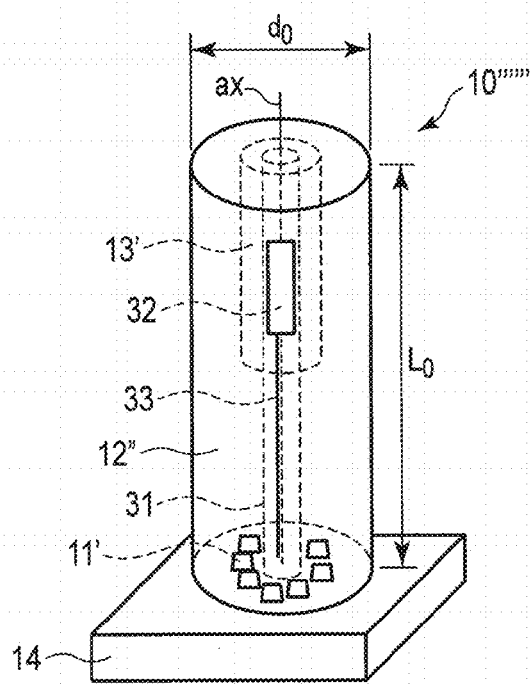
F I G. 12

LED LIGHTING DEVICE

CROSS-REFERENCE TO RELATED APPLICATION

This application is a Continuation Application of PCT Application No. PCT/JP2013/074772, filed Sep. 12, 2013 and based upon and claiming the benefit of priority from Japanese Patent Application No. 2012-207459, filed Sep. 20, 2012, the entire contents of all of which are incorporated herein by reference.

FIELD

Embodiments described herein relate generally to a LED lighting device.

BACKGROUND

Recently, technology that uses a remote phosphor to reduce a loss caused by return light has attracted attention. In a typical remote phosphor, an LED chip is disposed on a reflecting plate comprising a specular reflection plate or a diffuse reflection plate, over which a domed fluorescent layer is formed. The fluorescent layer is located at a distance from the LED chip so that the return light to the LED chip is reduced.

However, if the loss caused by return light is reduced by the remote phosphor in this manner, the size increase of the whole lighting device including the fluorescent layer and the LED is inevitable. For example, when the dimension of the LED chip is 1 mm, the size of the whole lighting device is about 1 to 2 cm.

BRIEF DESCRIPTION OF THE DRAWINGS

FIG. 11 is a schematic diagram showing a section of a LED lighting device according to another embodiment; and FIG. 12 is a perspective view showing a LED lighting device according to another embodiment.

DETAILED DESCRIPTION

A LED lighting device according to embodiment comprising an LED light source which generates light in an ultraviolet light region or a visible light region; an axisymmetric transparent member which is provided over the LED light source and which is transparent to visible light; and an axisymmetric light scattering member disposed in the axisymmetric transparent member apart from the LED light source. The LED light source has a light emitting surface with an area C, and has a substantially symmetrical light distribution around a light distribution symmetrical axis which substantially intersects at right angles with the light emitting surface. The axisymmetric transparent member has a first symmetrical axis which substantially corresponds to the light distribution symmetrical axis of the LED light source, and the axisymmetric transparent member is symmetrical to the first symmetrical axis. The axisymmetric light scattering member has a second symmetrical axis which substantially corresponds to the light distribution symmetrical axis of the LED light source. The axisymmetric light scattering member having a diameter $d_1$ of a bottom surface and a length $L_1$ along the second symmetrical axis is symmetrical to the second symmetrical axis. A distance of closest approach $L_2$ between the LED light source and the axisymmetric light scattering member, and the area C of the light emitting surface of the LED light source satisfy the relation represented by Expression (1).

$$L_2 > \sqrt{\frac{C}{4\pi}} \quad \text{Expression (1)}$$

The length $L_1$ of the axisymmetric light scattering member along the second symmetrical axis, and an absorption coefficient t (1/mm) of the axisymmetric light scattering member (here, scattered light is also considered as "absorbed" light) satisfy the relation of Expression (2).

$$L_1 \geq \frac{\log 2}{\mu} \quad \text{Expression (2)}$$

The diameter $d_1$ of the bottom surface of the axisymmetric light scattering member, the distance of closest approach $L_2$, and a refractive index n of the axisymmetric transparent member satisfy the relation of Expression (3).

$$d_1 \leq 2L_2\sqrt{n^2-1} \quad \text{Exression (3)}$$

A section of the axisymmetric light scattering member which intersects at right angles with the second symmetrical axis is included in a section of the axisymmetric transparent member in the former section, and a surface in which the axisymmetric transparent member is projected on a plane including the light emitting surface of the LED light source along the second symmetrical axis includes the light emitting surface of the LED light source.

Embodiments will be described below in detail.

Figure 1:
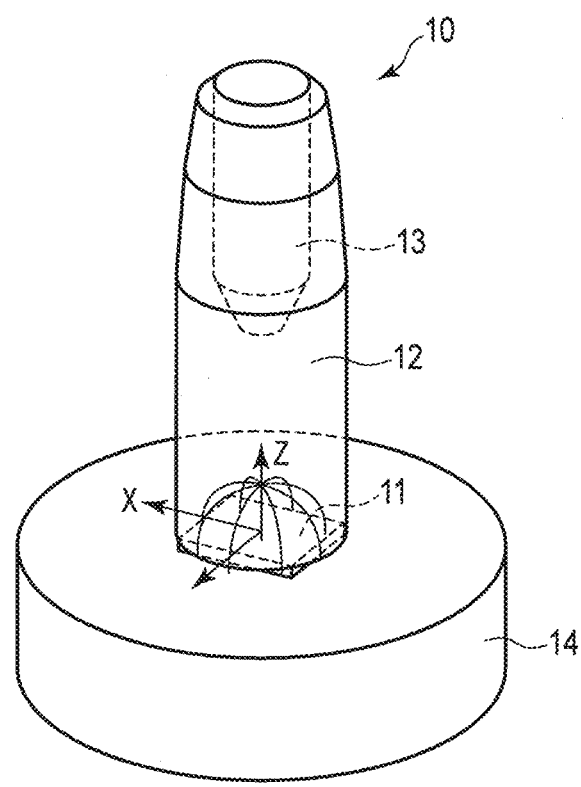
FIG. 1 is a perspective view showing a LED lighting device according to one embodiment.

As shown in FIG. 1, a LED lighting device 10 according to one embodiment includes an LED light source 11, and an axisymmetric transparent member 12 covering the LED light source. An axisymmetric light scattering member 13 is disposed in the axisymmetric transparent member 12 apart from the LED light source 11.

The LED light source 11 has a planar light emitting surface, and generates light in an ultraviolet light region or a visible light region. For example, an LED chip which generates monochromatic light having a peak wavelength of 390 to 460 nm can be used. More specifically, a blue LED chip which generates light having a peak wavelength of 450 nm is available.

In the present embodiment, a light distribution from the LED chip has a light distribution symmetrical axis, and is nearly symmetrical to the light distribution symmetrical axis. The light distribution includes, but not exclusively, for example, Lambertian. The light distribution symmetrical axis can pass through, but not exclusively, for example, the vicinity of the center of the light emitting surface of the LED chip, and may pass through any point in the same surface as the light emitting surface of the LED chip.

The LED light source 11 may be mounted on a substrate 14 if necessary. The substrate 14 can be made of, but not exclusively, a material that allows its mounting surface to diffusely reflect visible light. In this case, the light distribution can be larger. Alternatively, the mounting surface of the substrate may be made of a material transparent to visible light. In this case as well, light which passes through the substrate increases, and the light distribution can be larger. The material that diffusely reflects visible light includes, for example, metals such as aluminum and white resins. The material transparent to visible light includes, for example, transparent resins.

The axisymmetric transparent member 12 can be made of a transparent material that slightly absorbs visible light. The transparent material may be either an inorganic material or an organic material. The inorganic material includes, for example, glass and transparent ceramics. The organic material specifically includes a transparent resin selected from the group consisting of, for example, acrylic resin, silicone resin, epoxy resin, polycarbonate, polyethylene terephthalate (PET) resin, and polymethyl methacrylate (PMMA) resin. Here, transparency means the transmission of visible light, and will also be used below to mean the same unless otherwise noted. A refractive index n of the transparent member and a total reflection angle θc have the relation represented by Expression (A).

$$\sin\theta_c = \frac{1}{n} \qquad \text{Expression (A)}$$

The axisymmetric light scattering member 13 disposed inside the axisymmetric transparent member 12 can contain white particles that scatter ultraviolet light or visible light from the LED light source 11. The white particles may include, for example, Tec-Polymer or titanium oxide (TiO2). Alternatively, the light scattering member 13 may contain phosphor particles. When containing the phosphor particles, the light scattering member can be referred to as a fluorescent layer. The phosphor particles include, for example, a yellow light emitting fluorescent material. The yellow light emitting fluorescent material partly absorbs light from the LED light source, and then generates light in a visible region on a long-wavelength side. In addition to the fluorescent layer containing the yellow light emitting phosphor particles, a fluorescent layer containing red light emitting phosphor particles may be provided inside the axisymmetric transparent member 12.

The white particles and the phosphor particles can be dispersed in the transparent resin and used to form the axisymmetric light scattering member 13. Alternatively, the axisymmetric light scattering member 13 may be made of the particles alone. For example, this axisymmetric light scattering member can be formed by providing a space in a predetermined region inside the axisymmetric transparent member 12 and filling the space with the particles. The advantage in this case is the ease of production.

A metallic housing may be provided inside the axisymmetric light scattering member 13, and a power supply circuit may be provided therein. This allows heat generated from the LED and the power supply circuit to be conveyed to the axisymmetric transparent member 12 from the metallic housing and released to the outside. As a result, heat release properties are improved. Since the power supply circuit is provided inside the metallic housing, the whole lighting device can be compact.

The transparent resin in which particles are dispersed to constitute the light scattering member is not limited to the above-mentioned materials. Any transparent resin which is transparent to visible light and which is capable of retaining particles therein can be used.

In general, an absorption coefficient μ [1/mm] of the light scattering member can be defined by using a transmission amount in which to the flat-plate-shaped scattering member having a thickness of h [mm], parallel rays collimated in a direction that intersects at right angles with the flat plate are applied. The absorption coefficient μ is represented by Expression (B), $$\mu = -\frac{\log\left(\frac{I_T}{I_0}\right)}{h} \qquad \text{Expression (B)}$$

wherein $I_0$ is the incident intensity of the parallel rays, and $I_T$ is transmission intensity.

Figure 2:
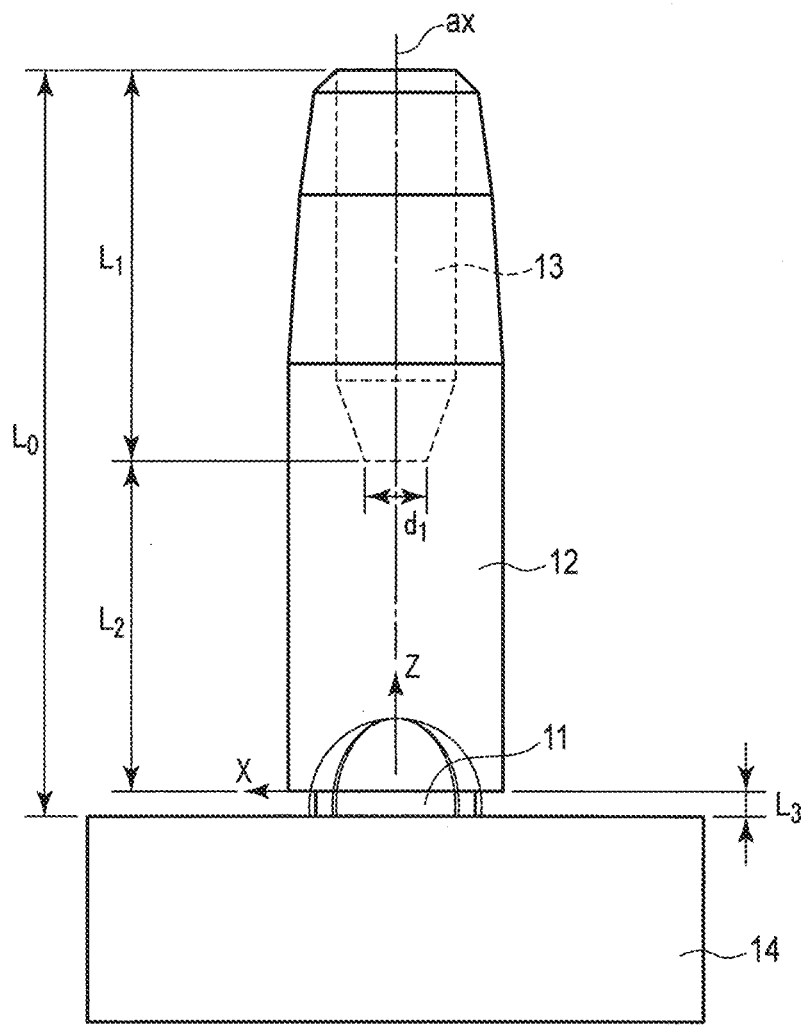
FIG. 2 is a schematic diagram showing a section of the LED lighting device according to one embodiment.

FIG. 2 shows the outline structure of a section of the LED lighting device according to one embodiment. Although the axisymmetric transparent member 12 is described out of contact with the substrate 14 in FIG. 2 to clarify a distance of closest approach $L_2$ between the axisymmetric light scattering member 13 and the LED light source 11, the axisymmetric transparent member may be actually provided in contact with the substrate 14. Alternatively, the axisymmetric transparent member may be in direct contact with the LED light source 11.

The light distribution symmetrical axis of the LED light source 11 is represented by a reference sign ax. The symmetrical axis of the axisymmetric transparent member 12 substantially corresponds to the light distribution symmetrical axis ax. The symmetrical axis of the axisymmetric light scattering member 13 also substantially corresponds to the light distribution symmetrical axis ax. Light generated from the LED light source 11 is required to be emitted to the outside of the LED lighting device through the light scattering member 13. Within the range of the product-by-product variation of the light distribution symmetrical axis of the LED light source, it can be considered that "the symmetrical axis substantially corresponds". The light emitting direction side along the light distribution symmetrical axis ax is a normal direction or an upper direction. This also applies to the following.

The distance of closest approach $L_2$ between the light scattering member 13 and the LED light source 11, and an area C of the light emitting surface of the LED light source 11 satisfy the relation represented by Expression (1).

$$L_2 > \sqrt{\frac{C}{4\pi}} \qquad \text{Expression (1)}$$

Consequently, a sufficient remote phosphor effect can be obtained.

The relation of Expression (2) is satisfied between a length $L_1$ (defined here as the minimum length of an interval that covers the axisymmetric light scattering member) of the axisymmetric light scattering member along the symmetrical axis, and the absorption coefficient μ (1/mm) of the axisymmetric light scattering member.

$$L_1 \geq \frac{\log 2}{\mu} \qquad \text{Expression (2)}$$

The relation of Expression (3) is satisfied between a diameter $d_1$ of the bottom surface of the light scattering member, the distance of closest approach $L_2$, and the refractive index n of the axisymmetric transparent member.

$$d_1 \leq 2L_2 \sqrt{n^2-1} \qquad \text{Expression (3)}$$

When the relation represented by Expression (3) is satisfied, it is ensured that the direct light from the LED light source 11 can be applied to the light scattering member 13 without escaping the light scattering member 13 and then being transmitted to the outside of the lighting device.

The following advantageous effects are obtained by the relation in Expression (3). That is, some of the direct light from the LED light source 11 escape being scattered on the bottom side of the light scattering member 13, are totally reflected by a side surface of the axisymmetric transparent member parallel to the symmetrical axis, and scattered in the upper part of the light scattering member 13 (farther from the LED light source 11). Thus, the direct light from the LED light source 11 escapes being totally scattered on the bottom side of the light scattering member 13, so that the remote phosphor effect is enhanced.

A section of the axisymmetric light scattering member 13 that intersects at right angles with the symmetrical axis is included in a section of the axisymmetric transparent member 12 within a plane that includes the former section. That is, within a plane that intersects at right angles with the symmetrical axis, it is ensured that the light scattering member 13 is covered with the transparent member 12. Moreover, a surface in which the axisymmetric transparent member 12 is projected on the light emitting surface of the LED light source 11 along the symmetrical axis includes the light emitting surface. This means that the light emitting surface of the LED light source 11 is included in the plane that intersects at right angles with the symmetrical axis of the axisymmetric transparent member 12. In other words, a surface of the axisymmetric transparent member 12 having the maximum diameter is larger than the light emitting surface of the LED light source 11.

As a result of fulfilling the conditions described above, it is possible to obtain a compact LED lighting device which achieves a low loss and low heat generation.

Figure 3:
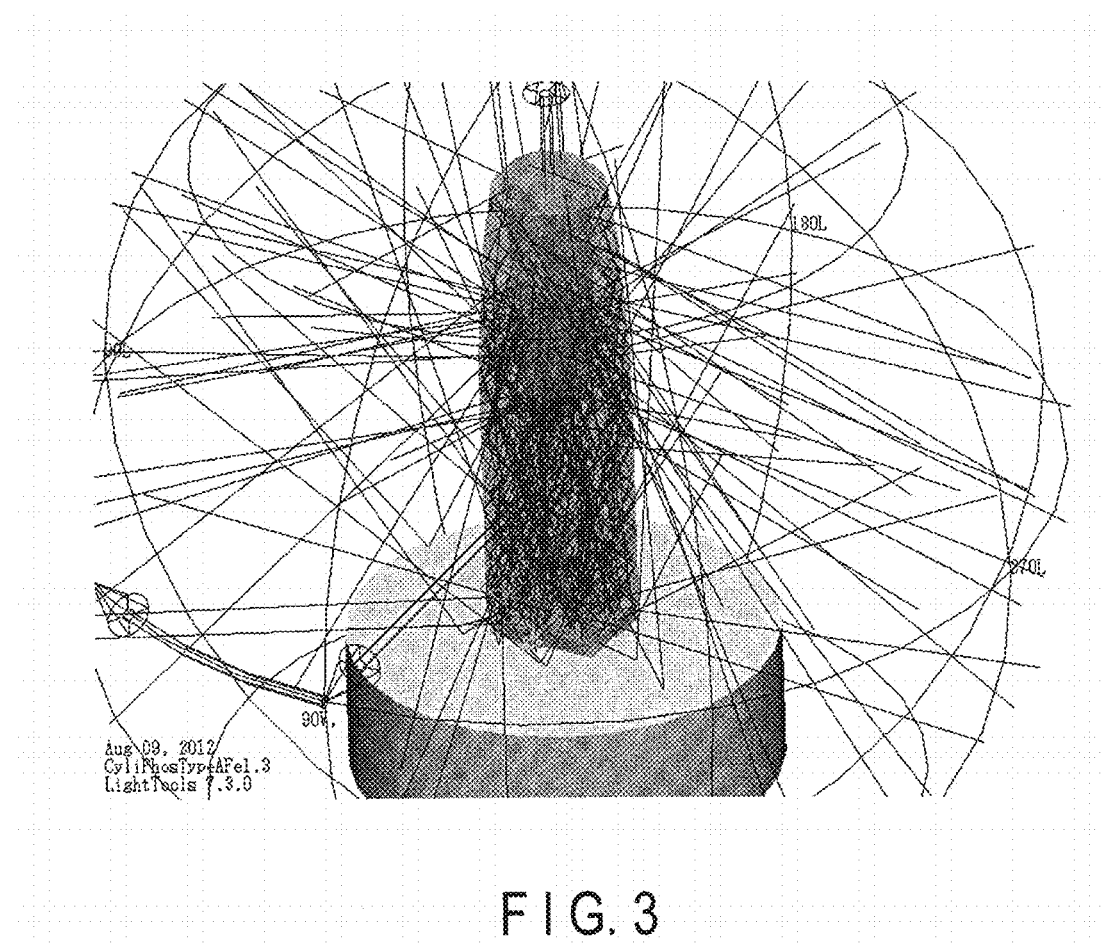
FIG. 3 is a schematic diagram showing a light tracking result for the LED lighting device according to one embodiment.

A light tracking result for the LED lighting device according to one embodiment is as shown in FIG. 3. As apparent from the light tracking result shown in FIG. 3, the direct light from the LED light source 11 is applied to and scattered by the light scattering member 13, and the direct light from the LED light source 11 is totally reflected by the axisymmetric transparent member 12, and applied to and scattered by the light scattering member 13.

Figure 4:
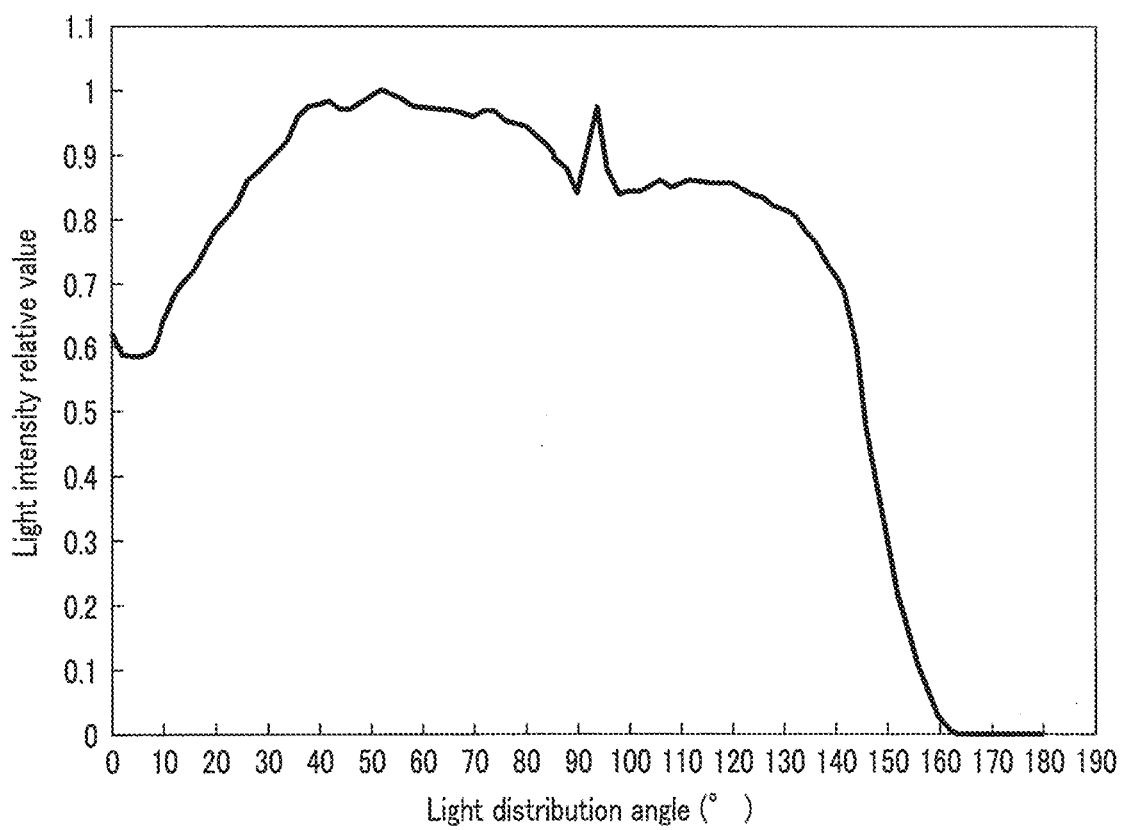
FIG. 4 is a graph showing the relation between the vertical light distribution angle and light intensity of the LED lighting device according to one embodiment.

FIG. 4 shows the light distribution of the LED lighting device according to one embodiment. In FIG. 4, the horizontal axis indicates a light distribution angle (deg.), and the vertical axis indicates light intensity (normalized). According to this graph, the light distribution angle at which the light intensity is reduced by half is about 145°, and the half light distribution angle (double the light distribution angle at which the light intensity is reduced to half of the peak) is 290°. This shows that a half light distribution angle of 290° is achieved.

Figure 5:
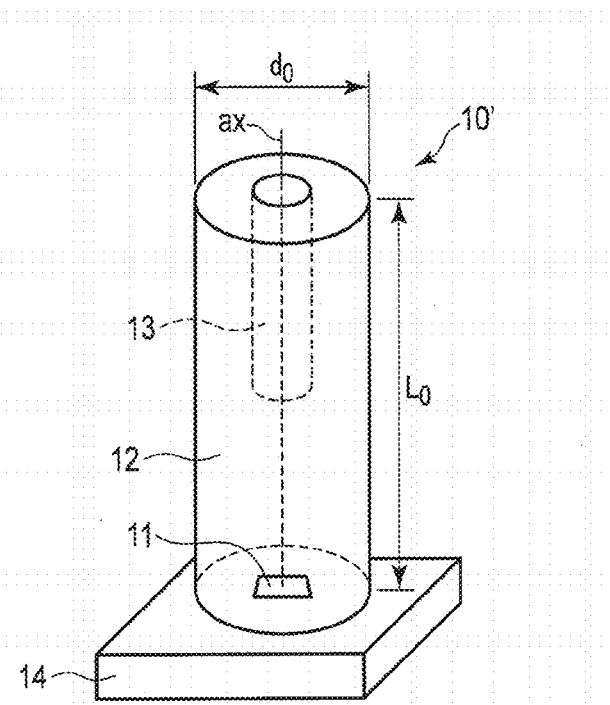
FIG. 5 is a perspective view showing a LED lighting device according to another embodiment.
Figure 6:
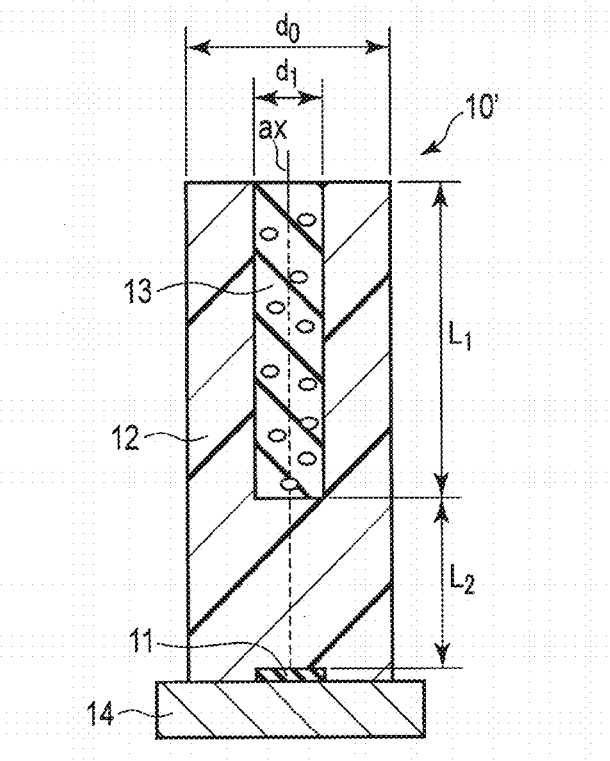
FIG. 6 is a schematic diagram showing a section of the LED lighting device shown in FIG. 5.

FIG. 5 shows a perspective view of a LED lighting device according to another embodiment. A LED lighting device 10' shown has a structure basically similar to that shown in FIG. 1 except that the axisymmetric transparent member 12 covering the LED light source and the axisymmetric light scattering member 13 are circularly cylindrical. A section of the LED lighting device 10' shown in FIG. 5 along the symmetrical axis is shown in FIG. 6.

Here, a blue LED chip which has a peak wavelength of 450 nm and which has a quadrate light emitting surface is used as the LED light source 11. The length of one side of the LED chip is 1 mm, and the thickness of the light emitting surface of the LED chip is 200 μm. The shape and dimensions of the light emitting surface of the LED chip can be suitably selected and are not limited to the above.

The LED light source 11 is disposed on the substrate 14 made of aluminum, and is covered with the axisymmetric transparent member 12. The axisymmetric transparent member 12 has a circularly cylindrical shape that uses the light distribution symmetrical axis ax as a symmetrical axis, and its bottom surface is in contact with the substrate 14. Here, PMMA (refractive index n=about 1.5) is used to constitute the transparent member 12.

The axisymmetric light scattering member 13 disposed inside the axisymmetric transparent member 12 has a circularly cylindrical shape that uses the light distribution symmetrical axis ax as a symmetrical axis, and is made of a silicone resin layer containing spherical yellow light emitting phosphor particles. However, the axisymmetric light scattering member 13 does not exclusively contain the silicone resin, and can contain any transparent resin. The yellow light emitting phosphor particles are uniformly dispersed in the silicone resin layer. The yellow light emitting phosphor particles absorb blue light emitted from the LED light source 11, and generates, for example, light having a peak wavelength of 550 nm. The absorption coefficient μ [1/mm] of the axisymmetric light scattering member 13 containing such yellow light emitting phosphor particles is 0.1.

Here, since the area C of the light emitting surface of the LED light source 11 equals 1 mm², a calculation in the following expression is performed.

$$\sqrt{\frac{C}{4\pi}} \cong 0.28$$

In the example shown in FIG. 6, the distance of closest approach $L_2$ between the LED light source 11 and the axisymmetric light scattering member 13 is 3 mm, which satisfies the relation represented by Expression (1).

$$L_2 > \sqrt{\frac{C}{4\pi}} \qquad \text{Expression (1)}$$

Since the absorption coefficient μ [1/mm] of the axisymmetric light scattering member 13 is 0.1, a calculation in the following expression is performed.

$$\log 2/\mu \cong 3.0$$

In the example shown in FIG. 6, the length $L_1$ of the axisymmetric light scattering member 13 is 3.0 mm, which satisfies the relation represented by Expression (2).

$$L_1 \geq \frac{\log 2}{\mu} \qquad \text{Expression (2)}$$

If the distance of closest approach $L_2$ and the refractive index n=about 1.5 are used, a calculation in the following expression is performed.

$$2L_2\sqrt{n^2-1} \cong 6.7$$

In the example shown in FIG. 6, the diameter $d_1$ of the axisymmetric light scattering member 13 is 1.41 mm, which satisfies the relation represented by Expression (3).

$$d_1 \leq 2L_2\sqrt{n^2-1} \qquad \text{Expression (3)}$$

In the example shown in FIG. 6, a diameter $d_0$ of the axisymmetric transparent member 12 is 3 mm, and the relation represented by Expression (4) is satisfied between the diameter $d_1$ of the axisymmetric light scattering member 13 and the distance of closest approach $L_2$.

$$\frac{d_1}{d_0} \geq \frac{2L_2}{L_1 + 2L_2} \qquad \text{Expression (4)}$$

The advantageous effects of the LED lighting device according to the present embodiment are described below.

However, in the case of these advantages described, a fluorescent material is enclosed as the axisymmetric light scattering member 13. Although a long-wavelength conversion resulting from the fluorescent material does not occur when white particles are enclosed, other advantages are similar.

Some of the blue light emitted from the LED light source 11 comprising the blue LED chip are directly applied to the axisymmetric light scattering member 13 containing the yellow phosphor particles and are then scattered and absorbed. Some of the light from the LED light source 11 are repeatedly totally reflected in the axisymmetric transparent member 12, and then scattered and absorbed by the axisymmetric light scattering member 13. The rest of the emitted light are not totally reflected in the axisymmetric transparent member 12, and emitted to the outside of the axisymmetric transparent member 12.

On the other hand, the axisymmetric light scattering member 13 absorbs the blue light and thereby generates yellow light closer to the long-wavelength side than the blue light in all directions (isotropically).

At the same time, the blue light scattered by the axisymmetric light scattering member 13 and the generated and scattered yellow light returns to the LED light source 11 and are absorbed therein. When the blue LED is directly coated with a phosphor layer, a loss caused by such return light has heretofore accounted for about 40 to 60% (e.g. refer to S. C. Allen, "ELIXIR-Solid-State Luminaire With Enhanced Light Extraction by Internal Reflection", Journal of Display Technology, vol. 3, No. 2, 2007). Thus, this loss can be reduced if the LED light source 11 and the light scattering member 13 are arranged at a sufficient distance from each other. This is generally referred to as the remote phosphor effect.

Some of the light generated from the bottom surface of the light scattering member 13 closest to the LED light source 11 return to the LED light source 11. The ratio can be roughly estimated to be a solid angle at which the LED light source 11 is viewed out of the entire solid angle around the light scattering member 13. That is, the ratio of the return light is represented by Expression (5).

$$\frac{C}{4\pi L_2^2} \qquad \text{Expression (5)}$$

When the value represented by Expression (5) is lower, there is less return light from the light scattering member 13 to the LED light source 11. On the other hand, the value represented by Expression (5) needs to be less than at least 1 to obtain the remote phosphor effect. Therefore, the relation represented by Expression (1) needs to be satisfied to obtain the remote phosphor effect.

$$L_2 > \sqrt{\frac{C}{4\pi}} \qquad \text{Expression (1)}$$

In the present embodiment, C=1 mm², so that the ratio of the return light represented by Expression (5) is about 0.8%.

When the LED light source 11 and the light scattering member 13 are thus located apart from each other, the temperature is lower than when the light scattering member 13 is closer to the LED light source. Thus, deterioration of the fluorescent material contained in the light scattering member 13 can be prevented (e.g. refer to N. Narendran, "Improved Performance White LED", Fifth International Conference on Solid State Lighting, Proceedings of SPIE 5941, 45-50, 2005).

White light can be obtained by properly mixing the blue light from the LED light source with the yellow light from the phosphor particles. If the direct light from the LED light source 11 reaches the outside, extremely high luminance is visually recognized. To avoid this, more than half of the light generated from the blue LED chip and emitted along the light distribution symmetrical axis ax needs to be absorbed by the light scattering member 13. Here, if the intensity of the light propagated in the light scattering member 13 along the light distribution symmetrical axis ax is I [W/mm²], a comparison ($I/I_0$) between I and the intensity $I_0$ [W/mm²] of the light immediately before applied to the light scattering member 13 is represented by Expression (6).

$$\frac{I}{I_0} = \exp(-\mu z) \qquad \text{Expression (6)}$$

(wherein μ is an absorption coefficient, and z is a propagation distance.)

The condition in which more than half of the light is absorbed by the light scattering member 13 can be represented by Expression (7).

$$\frac{I}{I_0} = \exp(-\mu z) \leq \frac{1}{2} \qquad \text{Expression (7)}$$

Expression (7) is transformed into Expression (8).

$$z \geq \frac{\log 2}{\mu} \quad \text{Expression (8)}$$

A length $L_1$ of the light scattering member 13 needs to satisfy Expression (8), and Expression (2) is thus derived.

Figure 7:
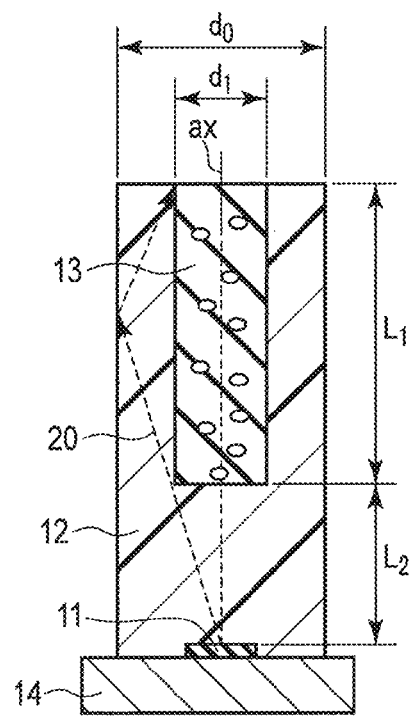
FIG. 7 is a diagram illustrating the operation of the LED lighting device shown in FIG. 5.

Now, a ray from the LED light source 11 is described with reference to FIG. 7. FIG. 7 is substantially similar to FIG. 6 except that a ray 20 is shown. The ray 20 from the LED light source 11 is totally reflected by the side surface of the transparent member 12 through the edge of the bottom surface of the light scattering member 13, and then reaches the light scattering member 13.

If the ray 20 is not totally reflected by but penetrates the side surface of the transparent member 12 parallel to the symmetrical axis, the blue light from the LED light source 11 is only emitted in this direction. The ray 20 is applied to the light scattering member 13 containing the yellow phosphor particles, so that the blue light from the LED light source 11 and the yellow light from the phosphor particles are mixed into white light. A wide light distribution angle can be obtained if the light is sufficiently scattered by the light scattering member 13. The advantage of this wide light distribution is particularly important when white particles are enclosed as the axisymmetric light scattering member 13. To fulfill such conditions, it is necessary to satisfy the relation represented by Expression (9).

$$\frac{\frac{d_1}{2}}{L_2} \leq \frac{1}{\tan\theta c} \quad \text{Expression (9)}$$

This is represented by Expression (3) if Expression (A) is used.

$$d_1 \leq 2L_2\sqrt{n^2-1} \quad \text{Expression (3)}$$

The relation represented by Expression (4) needs to be satisfied so that the ray is totally reflected by the side surface of the transparent member 12 parallel to the symmetrical axis and then applied to the light scattering member 13 through the edge of the bottom surface of the light scattering member 13.

$$\frac{d_1}{d_0} \geq \frac{2L_2}{L_1 + 2L_2} \quad \text{Expression (4)}$$

When the conditions described above are satisfied, the remote phosphor effect can be obtained. Moreover, white light is produced by the proper mixture of the blue light and the yellow light. At the same time, a wide light distribution resulting from wide diffusion can be obtained. This advantage is important when the fluorescent material includes white particles.

For the present embodiment, ZEMAX ray tracing is performed. ZEMAX is described in, for example, (Radiant Zemax homepage, "http://www.radiantzemax.com/en/rz/"). As a result, the light which returns to the LED light source 11 in the present embodiment accounts for about 10%, which proves a loss lower than when the return light has heretofore accounted for 40 to 60%. This, at the same time, allows the inhibition of heat generation in the blue LED chip as the LED light source caused by the absorption of the return light. That is, low heat generation is proved.

When an LED light source having a side of 1 mm is used, the LED lighting device according to the present embodiment is received in a circular cylinder having a diameter of 3 mm and a height of 7 mm. That is, in FIG. 5, the circular cylinder can have a diameter $d_0=3$ mm and a height $L_0=7$ mm. Compared to a height of 10 to 20 mm of a conventional LED lighting device that uses an LED light source having a similar size, it is apparent that the LED lighting device according to the present embodiment is compact.

As described above, according to the present embodiment, it is possible to obtain a compact LED lighting device which achieves a low loss and low heat generation.

Figure 8:
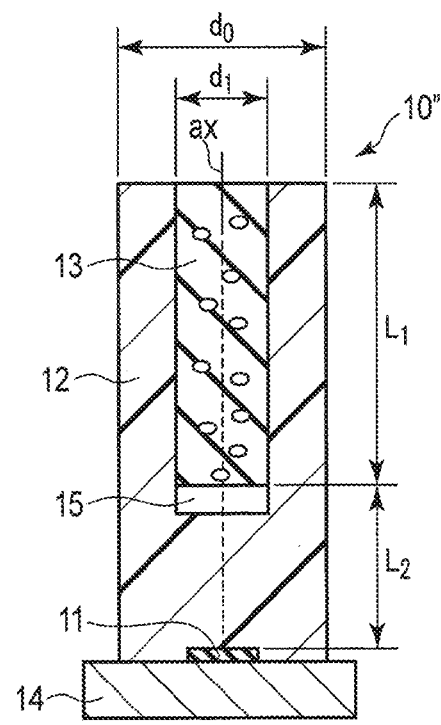
FIG. 8 is a schematic diagram showing a section of a LED lighting device according to another embodiment.

FIG. 8 is a schematic diagram showing the configuration of a section of a LED lighting device according to another embodiment. An LED lighting device 10" shown has a structure similar to that shown in FIG. 6 except that an air layer 15 is provided in contact with the bottom surface of the light scattering member 13. In the transparent member 12, yellow light which has been generated from the light scattering member 13 and which is to return to the LED light source 11 is present. However, when this air layer 15 is provided, the yellow light is totally reflected, and return light can be reduced.

In the light scattering member 13, the concentration of the phosphor particles can be provided with a distribution. Specifically, if the concentration of the phosphor particles increases upwards, more yellow light is generated in higher parts. In this case, the blue light is more scattered in higher parts. As a result, the remote phosphor effect is further enhanced.

Similar advantages are obtained when the sectional area of the phosphor particles in the light scattering member is larger in higher parts. For example, this structure can be obtained when the light scattering member has the following shape. Specifically, the light scattering member is provided with a part which is at the minimum diameter in its bottom surface and which increases in diameter upwards. For example, the light scattering member 13 shown in FIG. 1 corresponds to this shape.

Figure 9:
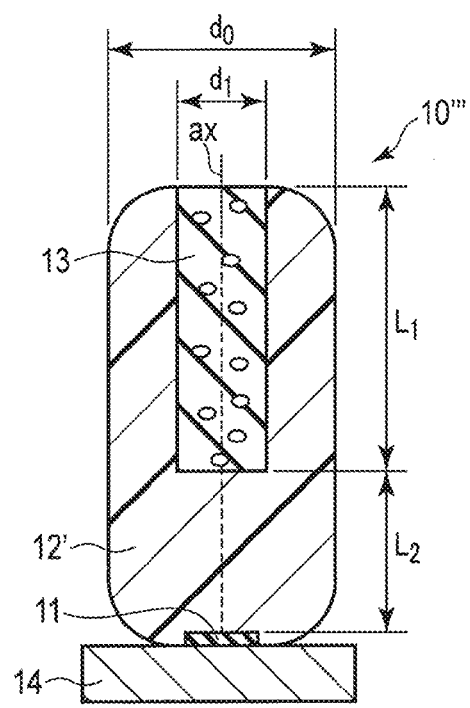
FIG. 9 is a schematic diagram showing a section of a LED lighting device according to another embodiment.

FIG. 9 is a schematic diagram showing the configuration of a section of a LED lighting device according to another embodiment. An LED lighting device 10''' shown has a structure similar to that shown in FIG. 6 except that the ends of the upper surface and lower surface of a transparent member 12' are curved surfaces.

Here, a z-axis is taken along the light distribution symmetrical axis ax, and the upward direction is a normal direction. The origin is a point at which the center of the light emitting surface of the LED light source 11 intersects with the light distribution symmetrical axis ax. Here, cylindrical coordinates are $(\rho_r, \rho_h)$. That is, the radius of the cylinder is $\rho_r$, and the height is $\rho_h$.

In this case, the curve at the end of the upper surface satisfies the relation represented by Expression (11).

$$\frac{\partial^2 \rho_r}{\partial \rho_h^2} < 0 \quad \text{Expression (11)}$$

On the other hand, the curve at the end of the lower surface satisfies the relations represented by Expression (12) and Expression (13) when e (interval from 0 to $\pi/2$) is a parameter.

$$\rho_r = \frac{\sqrt{C}}{2}\sin\Theta\exp\left(\frac{1}{\sqrt{n^2-1}}\left(\frac{\pi}{2}-\Theta\right)\right) \quad \text{Expression (12)}$$

$$\rho_h = \frac{\sqrt{C}}{2}\cos\Theta\exp\left(\frac{1}{\sqrt{n^2-1}}\left(\frac{\pi}{2}-\Theta\right)\right) \quad \text{Expression (13)}$$

The above-mentioned relation is derived on the basis of, for example, Julio Chaves, "Introduction to Nonimaging Optics", CRC Press, 2008.

The advantageous effects of the LED lighting device according to the present embodiment are described below.

The end of the upper surface of the transparent member 12 is a curved surface, so that the direct light from the LED light source 11 is totally reflected and applied to the light scattering member 13. On the other hand, scattered light from the light scattering member 13 is not totally reflected, and penetrates from this curved surface. That is, the direct light is temporarily converted into scattered light by the light scattering member 13, and the scattered light is emitted to the outside. On the other hand, the end of the lower surface of the transparent member 12 is a curved surface, so that the blue light which penetrates as it is without being totally reflected is reduced. As a result, the blue light from the LED light source 11 is properly mixed with the yellow light.

Figure 10:
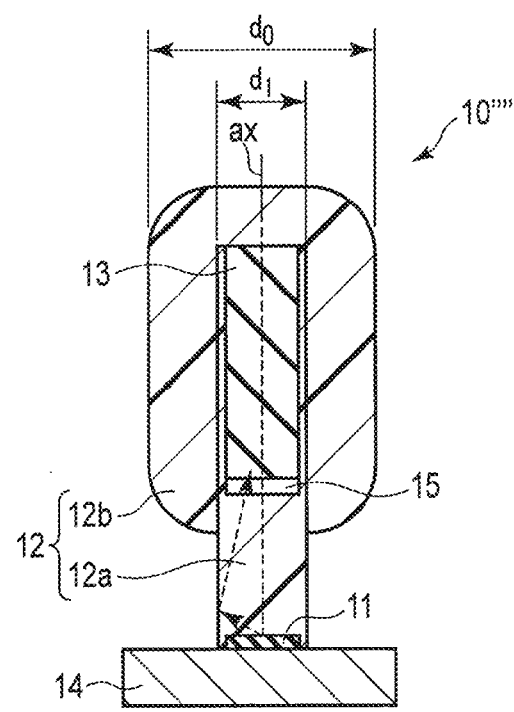
FIG. 10 is a schematic diagram showing a section of a LED lighting device according to another embodiment.

The axisymmetric transparent member 12 in the LED lighting device shown in FIG. 9 can be composed of two kinds of transparent members different in refractive index. An LED lighting device 10'''' shown in FIG. 10 comprises a transparent member 12 which includes a high-refractive-index transparent member 12a and a low-refractive-index transparent member 12b provided outside the high-refractive-index transparent member 12a. For example, transparent ceramics can be used for the high-refractive-index transparent member 12a. For example, PMMA can be used for the low-refractive-index transparent member 12b.

The low-refractive-index transparent member 12b is present outside the high-refractive-index transparent member 12a, so that total reflection is caused at the interface between the inside and the outside, and the light from the LED light source 11 is guided to the axisymmetric light scattering member 13. On the other hand, the light generated and reflected from the light scattering member 13 easily goes out because the low-refractive-index transparent member 12b is present therearound.

Such a configuration allows the light from the LED light source 11 to be guided to the light scattering member 13, and allows the light from the light scattering member 13 to be efficiently taken out.

FIG. 11 is a schematic diagram showing the configuration of a section of an LED lighting device according to another embodiment. An LED lighting device 10'''' shown has a structure similar to that shown in FIG. 9 except that the transparent member 12' has two kinds of axisymmetric fluorescent layers therein.

A first axisymmetric fluorescent layer 21 is provided in the axisymmetric transparent member 12' apart from the LED light source 11. A second axisymmetric fluorescent layer 22 is further provided apart from the first axisymmetric fluorescent layer 21. The first and second axisymmetric fluorescent layers have a symmetrical axis which substantially corresponds to the light distribution symmetrical axis ax. The first axisymmetric fluorescent layer 21 contains red phosphor particles, and absorbs blue light and then generates red light. On the other hand, the second axisymmetric fluorescent layer 22 contains yellow phosphor particles, and absorbs blue light and then generates yellow light.

The distance of closest approach $L_2$ between the LED light source 11 and the first axisymmetric fluorescent layer 21 satisfies the already-described relation represented by Expression (1).

$$L_2 > \sqrt{\frac{C}{4\pi}} \quad \text{Expression (1)}$$

In FIG. 11, an area $S_1$ of the upper surface of the first axisymmetric fluorescent layer 21 is 1.66 mm². If a distance of closest approach $L_4$ between the first axisymmetric fluorescent layer 21 and the second axisymmetric fluorescent layer 22 is 2 mm, the relation represented by Expression (21) is satisfied.

$$L_4 > \sqrt{\frac{S_1}{4\pi}} \quad \text{Expression (21)}$$

The advantageous effects of the LED lighting device according to the present embodiment are described below.

The first axisymmetric fluorescent layer 21 containing the red phosphor particles also absorbs yellow light. On the other hand, the second axisymmetric fluorescent layer 22 containing the yellow phosphor particles does not absorb red light. Therefore, the red light is not absorbed by the second axisymmetric fluorescent layer 22, and scattered in the transparent member 12' and then escapes upwards. As a result, a loss of the yellow light absorbed in the first axisymmetric fluorescent layer 21 (a loss in conventional devices) can be reduced.

The first axisymmetric fluorescent layer 21 containing the red phosphor particles is at a sufficient distance from the second axisymmetric fluorescent layer 22 containing the yellow phosphor particles, so that the remote phosphor effect is enhanced. As a result, a loss of the yellow light absorbed in the first axisymmetric fluorescent layer 21 containing the red phosphor particles (a loss in conventional devices) can be also reduced.

FIG. 12 is a perspective view showing the configuration of an LED lighting device according to another embodiment. An LED lighting device 10''''' shown has a structure similar to that shown in FIG. 5 except that a heat release housing 31 is provided in an axisymmetric light scattering member 13' and a transparent member 12'' and a power supply circuit 32 and a wiring line 33 are further provided therein. However, as an LED light source 11', multiple LEDs having rectangular light emitting surfaces are axisymmetrically arranged with respect to the light distribution symmetrical axis ax. The center of the light emitting surface of each of the LED light sources is at an equal distance RR from the light distribution symmetrical axis.

The heat release housing 31 is made of a metal, and can be made of, for example, aluminum or copper. A cavity may be provided in the housing, and a power supply circuit may be disposed in the cavity. Thus, heat generated from the LEDs and the power supply circuit is conveyed to the axisymmetric transparent member 12 from the metallic housing and released to the outside, so that heat release properties are improved. Since the power supply circuit is provided inside the metallic housing, the whole lighting device can be compact.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An LED lighting device comprising:
an LED light source which generates light in an ultraviolet light region or a visible light region;
an axisymmetric transparent member which is provided over the LED light source and which is transparent to visible light; and
an axisymmetric light scattering member disposed in the axisymmetric transparent member apart from the LED light source,
wherein the LED light source has a light emitting surface with an area C, and has a substantially symmetrical light distribution around a light distribution symmetrical axis which substantially intersects at right angles with the light emitting surface,
the axisymmetric transparent member has a first symmetrical axis which substantially corresponds to the light distribution symmetrical axis of the LED light source, and the axisymmetric transparent member is symmetrical to the first symmetrical axis,
the axisymmetric light scattering member has a second symmetrical axis which substantially corresponds to the light distribution symmetrical axis of the LED light source, the axisymmetric light scattering member having a diameter $d_1$ of a bottom surface and a length $L_1$ along the second symmetrical axis is symmetrical to the second symmetrical axis, and a distance of closest approach $L_2$ between the LED light source and the axisymmetric light scattering member, and the area C of the light emitting surface of the LED light source satisfy the relation represented by Expression (1), $$L_2 > \sqrt{\frac{C}{4\pi}} \qquad \text{Expression (1)}$$

the length $L_1$ of the axisymmetric light scattering member along the second symmetrical axis, and an absorption coefficient $\mu$ (1/mm) of the axisymmetric light scattering member satisfy the relation of Expression (2), $$L_1 \geq \frac{\log 2}{\mu} \qquad \text{Expression (2)}$$

the diameter $d_1$ of the bottom surface of the axisymmetric light scattering member, the distance of closest approach $L_2$, and a refractive index $n$ of the axisymmetric transparent member satisfy the relation of Expression (3), $$d_1 \leq 2L_2\sqrt{n^2-1} \qquad \text{Expression (3)}$$

a section of the axisymmetric light scattering member which intersects at right angles with the second symmetrical axis is included in a section of the axisymmetric transparent member in the former section, and
a surface in which the axisymmetric transparent member is projected on a plane including the light emitting surface of the LED light source along the second symmetrical axis includes the light emitting surface of the LED light source.

2. The LED lighting device of claim 1, wherein the axisymmetric transparent member is circularly cylindrical.

3. The LED lighting device of claim 2, satisfying Expression (4), $$\frac{d_1}{d_0} \geq \frac{2L_2}{L_1 + 2L_2} \qquad \text{Expression (4)}$$

(wherein $d_0$ is the diameter of the axisymmetric transparent member, $d_1$ is the diameter of the bottom surface of the axisymmetric light scattering member, $L_1$ is the length of the axisymmetric light scattering member along the second symmetrical axis, and $L_2$ is the distance of closest approach between the light emitting surface of the LED light source and the light scattering member).

4. The LED lighting device of claim 1, wherein the axisymmetric light scattering member is circularly cylindrical.

5. The LED lighting device of claim 1, further comprising an axisymmetric air layer in contact with the bottom surface of the axisymmetric light scattering member,
wherein the axisymmetric air layer has a third symmetrical axis which substantially corresponds to the light distribution symmetrical axis of the LED light source, and
the axisymmetric air layer is symmetrical to the third symmetrical axis.

6. The LED lighting device of claim 1, wherein the axisymmetric light scattering member has a part which is at the minimum diameter in its bottom surface and which increases in diameter upwards.

7. The LED lighting device of claim 1, wherein the axisymmetric transparent member has a part which is at the minimum diameter in its upper surface and which increases in diameter downwards.

8. An LED lighting device comprising:
an LED light source which generates light in an ultraviolet light region or a visible light region;
an axisymmetric transparent member which is provided over the LED light source and which is transparent to visible light;
a first axisymmetric fluorescent layer disposed in the axisymmetric transparent member apart from the LED light source; and
a second axisymmetric fluorescent layer disposed in the axisymmetric transparent member above the first axisymmetric fluorescent layer and apart from the first axisymmetric fluorescent layer,
wherein the LED light source has a light emitting surface with an area C and a light distribution symmetrical axis which substantially intersects at right angles with the light emitting surface, and the LED light source has a substantially symmetrical light distribution around the light distribution symmetrical axis,
the axisymmetric transparent member has a first symmetrical axis which substantially corresponds to the light distribution symmetrical axis of the LED light source, and has a shape symmetrical with respect to the first symmetrical axis, the first axisymmetric fluorescent layer absorbs some of the light from the LED light source to generate first light in a visible region closer to a long-wavelength side than the light from the LED light source, the first axisymmetric fluorescent layer has a second symmetrical axis which substantially corresponds to the light distribution symmetrical axis of the LED light source, the first axisymmetric fluorescent layer having an upper surface with an area $S_1$, and is symmetrical to the second symmetrical axis, and a distance of closest approach $L_2$ between the LED light source and the first axisymmetric fluorescent layer, and an area C of the light emitting surface of the LED light source satisfy the relation represented by Expression (1), and $$L_2 > \sqrt{\frac{C}{4\pi}} \qquad \text{Expression (1)}$$

the second axisymmetric fluorescent layer absorbs some of the light from the LED light source to generate second light longer in wavelength than the light from the LED light source and shorter in wavelength than the first light, the second axisymmetric fluorescent layer has a third symmetrical axis which substantially corresponds to the light distribution symmetrical axis of the LED light source, and a distance of closest approach $L_4$ between the first axisymmetric fluorescent layer and the second axisymmetric fluorescent layer, and the area $S_1$ of the upper surface of the first axisymmetric fluorescent layer satisfy the relation represented by Expression (21), $$L_4 > \sqrt{\frac{S_1}{4\pi}} \qquad \text{Expression (21)}$$

9. The LED lighting device of claim 1, wherein the LED light source emits monochromatic light having a peak wavelength of 390 to 460 nm.

10. The LED lighting device of claim 1, further comprising a substrate having a mounting surface on which the LED light source is mounted and which diffusely reflects visible light.

11. The LED lighting device of claim 1, further comprising a substrate having a mounting surface on which the LED light source is mounted and which is transparent to visible light.

12. The LED lighting device of claim 2, wherein the axisymmetric transparent member has, at the end of its bottom surface, a curved surface represented by Expression (12) and Expression (13), $$\rho_r = \frac{\sqrt{C}}{2}\sin\Theta\exp\left(\frac{1}{\sqrt{n^2-1}}\left(\frac{\pi}{2}-\Theta\right)\right) \qquad \text{Expression (12)}$$

$$\rho_h = \frac{\sqrt{C}}{2}\cos\Theta\exp\left(\frac{1}{\sqrt{n^2-1}}\left(\frac{\pi}{2}-\Theta\right)\right) \qquad \text{Expression (13)}$$

(wherein $\rho_r$ and $\rho_h$ are a radius and a height in cylindrical coordinates symmetrical to a z-axis, respectively, the z-axis has an origin at the intersection of the light distribution symmetrical axis and the light emitting surface, and the upward direction of the z-axis is a normal direction, C is the area of the light emitting surface of the LED light source, and $\Theta$ is an interval of a parameter ($0<\Theta<\pi/2$)).

13. The LED lighting device of claim 10, wherein multiple LED light sources are mounted on the substrate, and the center of the light emitting surface of each of the LED light sources is at an equal distance RR from the light distribution symmetrical axis, the LED lighting device further comprising an axisymmetric heat transmitting member which pierces the axisymmetric light scattering member and the axisymmetric transparent member at the same time, the heat transmitting member having a maximum radius less than or equal to the RR and being thermally joined to the LED light sources or the substrate.

* * * * *